United States Patent [19]
DiMaria et al.

[11] 4,104,675
[45] Aug. 1, 1978

[54] MODERATE FIELD HOLE AND ELECTRON INJECTION FROM ONE INTERFACE OF MIM OR MIS STRUCTURES

[75] Inventors: Donelli J. DiMaria, Mt. Kisco; Donald R. Young, Ossining, both of N.Y.

[73] Assignee: International Business Machines Corporation, Armonk, N.Y.

[21] Appl. No.: 808,501

[22] Filed: Jun. 21, 1977

[51] Int. Cl.$^2$ ............................................. H01L 29/34
[52] U.S. Cl. ...................................... 357/54; 357/23; 357/91
[58] Field of Search ............................. 357/23, 54, 91

[56] References Cited
U.S. PATENT DOCUMENTS

| | | | |
|---|---|---|---|
| 3,972,059 | 7/1976 | DiStefano | 357/6 |
| 4,047,974 | 9/1977 | Harari | 148/1.5 |

Primary Examiner—Martin H. Edlow
Attorney, Agent, or Firm—Sughrue, Rothwell, Mion, Zinn and Macpeak

[57] ABSTRACT

A graded oxide MIM or MIS structure employs band gap grading of the insulator oxide so that holes or electrons (depending on voltage bias) can be injected into the insulator oxide under moderate electric field conditions from the contact at one interface. Electron or hole injection from the opposite interface is blocked due to the larger insulator band gap near this interface. A graded oxide metal-silicon dioxide-silicon (MGOS) semiconductor structure may be fabricated by forming several pyrolytic or CVD $SiO_2$ layers over a relatively thick thermal $SiO_2$ layer, with the pyrolytic $SiO_2$ layers having sequentially increasing excess Si content. This structure may also be fabricated by controlled Si ion implantation in the thermal $SiO_2$ layer.

8 Claims, 7 Drawing Figures

MODERATE FIELD HOLE AND ELECTRON INJECTION FROM ONE INTERFACE OF MIM OR MIS STRUCTURES

BACKGROUND OF THE INVENTION

The present invention generally relates to semiconductor devices which use a graded band gap structure to promote the injection of holes or electrons at one interface of an insulator under moderate electric field conditions while, simultaneously, electron or hole injection from the opposite interface is blocked. More particularly, the present invention, in a preferred embodiment, relates to a graded oxide metal-silicon dioxide-silicon (MGOS) semiconductor structure which is useful in performing a memory function.

Semiconductor memory devices in various configurations are known in the art. One such device, known as a beam addressable MOS, employs a metal-oxide-semiconductor structure, including a PN junction, wherein charges are stored in the structure by writing with an electron beam. Readout is also performed with an electron beam, but at a lower current level. The readout is not totally destructive in that upwards of 10 readouts can be performed before the charge in a memory cell must be renewed. The advantage of this device is that very high memory densities can be achieved. Among the disadvantages, however, are the requirement for an electron beam with a high vacuum, precision electron optics and deflection circuitry which result in a high cost.

FET memory devices are also known in the art. One such device employs a $MI_1I_2S$ structure wherein $I_1$ and $I_2$ denote first and second insulator layers. The $I_1I_2$ interface may include a metallic impurity which provides a well-defined electron trapping region. The presence or absence of trapped electrons in this region is used to define a memory function either by different values of capacitance of the structure or by monitoring the value of source-drain current as affected by the trapped electron charges in the presence of suitable-applied gate voltages. Metallic impurities are not always required at the $I_1 I_2$ interface as the same effect can be realized by using two different kinds of insulators. For example, one such known device employs a MNOS structure where a thin oxide film is first formed on a silicon substrate, and over this thin oxide film is laid a much thicker silicon nitride film. In this structure, electrons or holes are trapped in the silicon nitride layer. This particular structure has the advantage, when compared with the beam addressable MOS structure, of requiring much simpler equipment for performing the reading and writing operations in the memory device. There is a disadvantage associated with this particular structure, however, and that relates to the thin oxide layer. This oxide layer must be quite thin, on the order of about 20 Å thick, in order to allow tunneling of the electrons or holes from the Si substrate. Reliability problems have been encountered with memory devices with this thin tunnel oxide layer because of the high fields across it during operation.

SUMMARY OF THE INVENTION

The present invention uses a graded band gap structure to make a charge storage device wherein injection of holes or electrons from one contact is possible without compensating injection of electrons or holes from the other contact. An example of a structure employing this band gap reduction is an MGOS FET to perform a memory function. More specifically, the MGOS structure employs hole trapping near the Si—$SiO_2$ interface of the gate structure in a FET configuration. The "write" step involves hole injection from the gate electrode under moderate voltage bias and transport to the Si—$SiO_2$ interface where some of the positively-charged holes are trapped in a very stable manner. The "erase" step involves electron injection from the gate electrode under moderate negative voltage bias and transport to the Si—$SiO_2$ interface where the electrons would annihilate trapped holes very readily. The "read" operations uses the transconductance of the silicon surface to sense the charged state of the oxide region near the Si—$SiO_2$ interface and uses low gate voltages to prevent further charging of this region.

The band gap graded structure may be fabricated by forming several pyrolytic or CVD $SiO_2$ layers over a relatively thick thermal $SiO_2$ layer with the pyrolytic $SiO_2$ layers having sequentially increasing excess Si content. The structure may also be fabricated by controlled Si ion implantation in the thermal $SiO_2$ layer.

BRIEF DESCRIPTION OF THE DRAWINGS

Other advantages, aspects and uses of the invention will become apparent from the following detailed description, taken in connection with the accompanying drawings, in which.

DESCRIPTION OF THE PREFERRED EMBODIMENT

Figure 1:
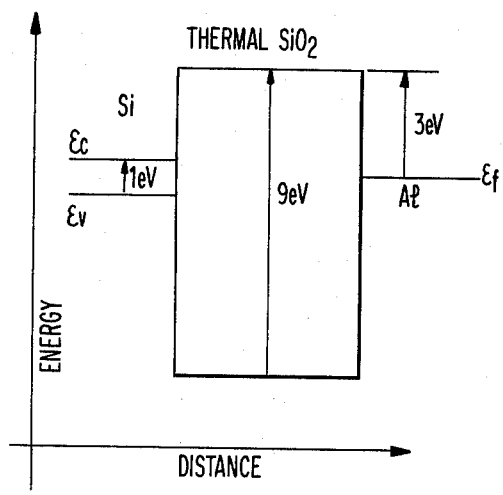
FIG. 1 is an energy band diagram of a conventional MOS structure.

In the energy band diagram of a conventional MOS structure shown in FIG. 1, the $\epsilon_v$ level is the valence level and the $\epsilon_c$ level is the conduction level in the silicon substrate. The conduction level $\epsilon_c$ is typically one electron volt higher than the valence level $\epsilon_v$. The $\epsilon_f$ level is the fermi level of the metal electrode, in this case, aluminum. The fermi level $\epsilon_f$ in the energy diagram lies somewhere between the valence level $\epsilon_v$ and the conduction level $\epsilon_c$ of the silicon substrate. Between the silicon substrate and the aluminum contact is an insulator of thermal $SiO_2$. In this insulator, the energy level difference between the valence level and the conduction level is on the order of nine electron volts. In addition, the difference between the fermi level $\epsilon_f$ of the aluminum contact and the conduction level in the thermal $SiO_2$ is on the order of three electron volts. As a result, the thermal $SiO_2$ represents a substantial barrier to conduction between the silicon substrate and the aluminum contact.

By reducing the band gap of the insulator layer of $SiO_2$ near the $Al-SiO_2$ interface, holes or electrons (depending on voltage bias) can be injected into the insulator under moderate electric field conditions from the aluminum contact at this interface. Simultaneously, electron or hole injection from the opposite $Si-SiO_2$ interface is blocked due to the larger insulator band gap near this interface. This graded band gap structure is represented by the energy band diagram of FIG. 2. The continuous grading of the insulator band gap, as illustrated by FIG. 2, could be achieved by ion implantation of silicon, for example, at controlled depths adjacent to the $Al-SiO_2$ interface.

Figure 2:
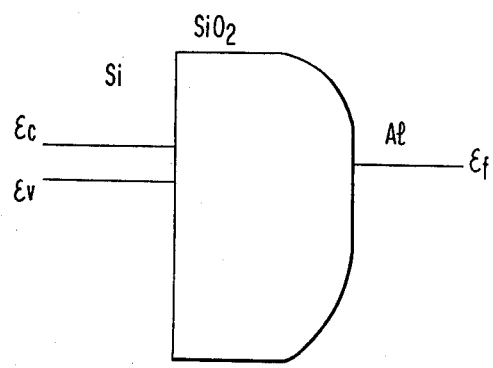
FIG. 2 is an energy band diagram similar to that of FIG. 1, except that the band gap of the oxide continuously decreases toward the metal electrode interface.
Figure 3:
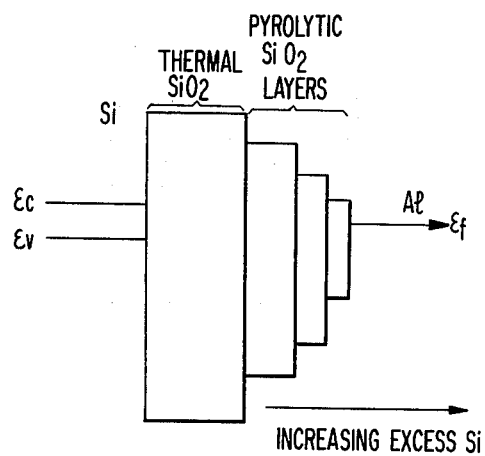
FIG. 3 is an energy band diagram which is a stepped approximation the continuously graded energy band gap represented by FIG. 2.
Figure 4:
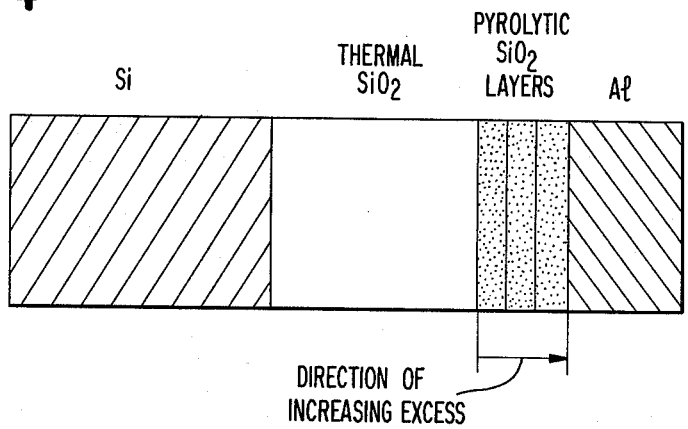
FIG. 4 is a cross-sectional view of an MGOS structure which exhibits the characteristics of the energy band diagram shown in FIG. 3.

According to a preferred embodiment of the invention, the continuous grading of the band gap of the insulator, as shown in FIG. 2, is a stepped approximation, as illustrated in FIG. 3. The specific structure which produces the energy band gap diagram, shown in FIG. 3, is shown in a generalized cross-sectional view in FIG. 4. Starting with a single crystal silicon substrate, a relatively thick thermal $SiO_2$ insulator layer is grown. Over this thermal oxide insulator layer are deposited successive pyrolytic or chemical vapor deposition (CVD) $SiO_2$ layers. In FIG. 4, three such layers are shown, but any number of layers may be used. Each pyrolytic oxide layer is relatively thin compared to the overall thermal oxide insulator layer; and each successive pyrolytic oxide layer has an increasing amount of excess silicon. It is known that pyrolytic oxide layers can be formed with excess silicon as described, for example, in U.S. Pat. No. 3,649,884. The number of pyrolytic layers, the thickness of each layer, and the amount of excess silicon in each successive layer is a matter of design choice. It will be understood by those skilled in the art, however, that a closer approximation to the continuously graded band gap, as represented by FIG. 2, may be achieved by many small steps. The thermal oxide layer, on the other hand, must be sufficiently thick when compared with the graded oxide layers to prevent any charge trapping or detrapping in the graded oxide layers from being sensed by the silicon substrate. This thick thermal oxide layer avoids the reliability problems encountered with memory devices with thin tunnel oxide layers like the MNOS structure.

Figure 5:
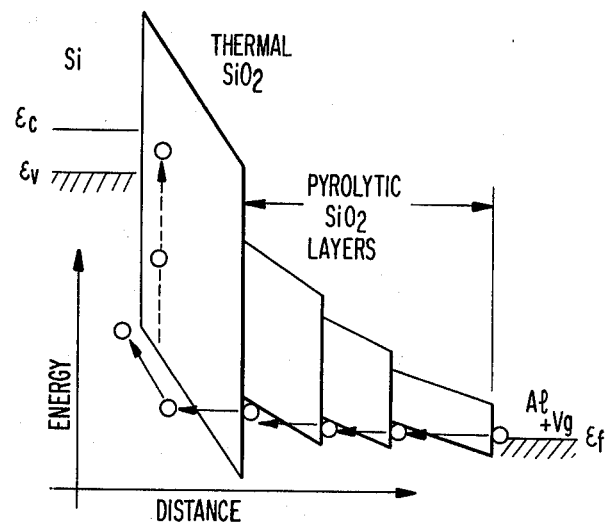
FIG. 5 is the energy band diagram of the MGOS structure of FIG. 4 for positive gate bias indicating hole injection and capture.

FIG. 5 is an energy band diagram for a positive gate bias applied to the metal contact in the structure shown in FIG. 4. In other words, for a positive gate bias, the fermi level $\epsilon_f$ of the aluminum contact is substantially lowered with respect to the valence level $\epsilon_v$ of the silicon substrate. Under this condition for gate bias, holes represented by open circles tunnel from the gate electrode into the first pyrolytic oxide layer valence band, and then tunnel sequentially from one oxide layer to the next, as represented by the solid arrows. The hole is captured within about 50 Å of the $Si-SiO_2$ interface, as represented by the dashed arrows. An accumulation of holes at this interface provides a charge storage which can be used to perform a memory function. That is, the "write" step involves hole injection from the gate under moderate positive voltage bias and tunneling to the $Si-SiO_2$ interface where some of the positively-charged holes are trapped in a very stable manner.

Figure 6:
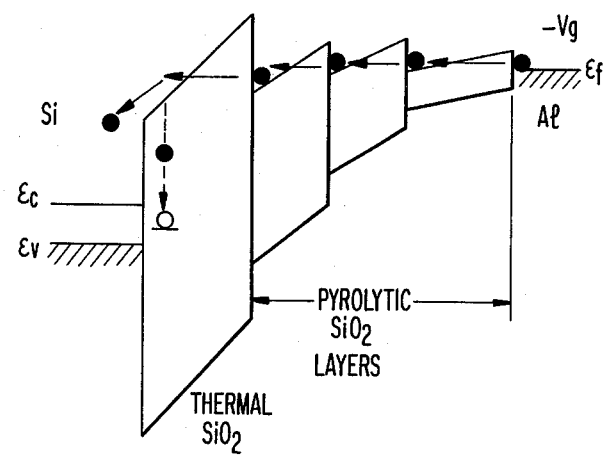
FIG. 6 is an energy band diagram of the MGOS structure of FIG. 4 for negative gate bias indicating electron injection and annihilation of a trapped hole.

With the application of a negative gate bias, the fermi level $\epsilon_f$ of the aluminum contact is raised substantially above the conduction level $\epsilon_c$ of the silicon substrate, as shown in FIG. 6. Under this condition of negative bias, electrons are injected at the aluminum contact into the first pyrolytic oxide layer conduction band, and then tunnel sequentially from one oxide layer to the next. Once in the conduction band of the thermal oxide layer, the electrons may recombine with previously-trapped holes. Thus, this mechanism provides an "erase" step which involves electron injection from the gate under moderate negative voltage bias and tunneling to the $Si-SiO_2$ interface where the electrons annihilate trapped holes very readily.

The "read" operation uses the transconductance of the silicon surface to sense the charge state of the oxide region near the $Si-SiO_2$ interface at low gate voltages to prevent further charging of this region. Because of the thickness of the thermal oxide layer, charge trapping or detrapping in the graded pyrolytic oxide layers is not sensed by the silicon during the "read" operations. Also the magnitude of the applied field during the "read" operation is substantially smaller than the field applied for injection.

Figure 7:
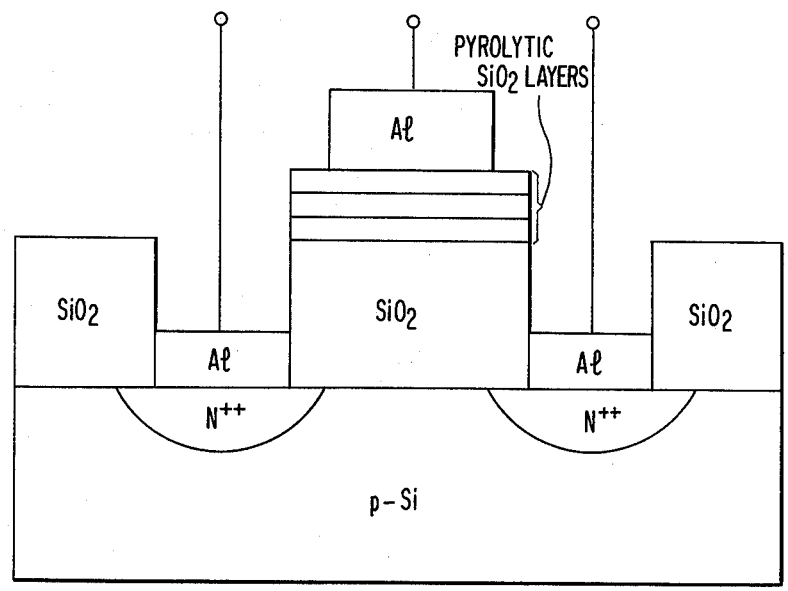
FIG. 7 is a generalized cross-sectional view of a MGOS FET structure according to the invention.

A MGOS FET device is shown in FIG. 7. The device employs a gate structure like that shown in FIG. 4 but is otherwise conventional. An array of these FET devices would provide for long-term storage, nondestructive readout and low voltage drive requirements.

While the invention has been described in terms of a preferred embodiment, those skilled in the art will understand that various modifications can be made in the practice of the invention without departing from the scope of the appended claims. For example, although the preferred embodiment of the invention has been described in terms of a MOS or MIS structure, the teachings of the invention are equally applicable to MIM or metal-insulator-metal structures. Moreover, while the gate structure of the preferred embodiment has been described as comprising an aluminum contact, those skilled in the art will recognize that other metals or semiconductors could be used. Specifically, polycrystalline silicon could be deposited over the pyrolytic oxide layers to form the gate electrode contact.

We claim:

1. A metal-insulator-metal or metal-insulator-semiconductor structure wherein the band gap of the insulator layer near one interface only is reduced to provide an injection region where holes or electrons, depending on voltage bias, can be injected into the insulator under moderate electric field conditions from the contact at this interface while, simultaneously, electron or hole injection from the opposite interface is blocked due to the large insulator band gap near this interface.

2. The structure of claim 1 comprising a silicon substrate having thereon a relatively thick thermal oxide insulator layer and a metal or semiconductor electrical contact on the thermal oxide insulator layer, said thermal oxide having a decreasing band gap in the vicinity of the electrical contact interface, said decreasing band gap being produced by ion implantation.

3. The structure recited in claim 1 comprising a silicon substrate having a first relatively thick thermal oxide insulator thereon over which is deposited a plurality of relatively thin pyrolytic oxide layers, each successively deposited pyrolytic oxide layer containing an increasing excess silicon content, and a metal or semiconductor contact on the last deposited pyrolytic oxide layer.

4. A graded oxide metal-silicon dioxide-silicon MGOS FET structure having an injection region adjacent to the gate electrode, said injection region comprising a thin graded band gap.

5. The MGOS FET structure as recited in claim 4 wherein the gate structure comprises a relatively thick thermal oxide formed on a silicon substrate and a plurality of relatively thin pyrolytic oxide layers formed over the thermal oxide, each successive pyrolytic oxide layer containing an increasing excess silicon content.

6. In a MOS FET device for performing a memory function, said device being of the type comprising a silicon substrate having source and drain regions formed therein and an insulated gate structure formed between said source and drain regions, the improvement wherein the band gap of the insulator of the insulated gate structure is reduced near the gate electrical contact interface to provide an injection region wherein holes or electrons, depending on voltage bias, can be injected into the insulator under moderate electric field conditions from the gate electrical contact while, simultaneously, electron or hole injection from the substrate interface is blocked due to the large insulator band gap at this interface.

7. The MOS FET device of claim 6 wherein the insulator comprises a thermal oxide having a decreasing band gap in the vicinity of the gate electrical contact interface, said decreasing band gap being produced by ion implantation.

8. The MOS FET device of claim 6 wherein the insulator comprises a first relatively thick thermal oxide layer over which is deposited a plurality of relatively thin pyrolytic oxide layers, each successively deposited pyrolytic oxide layer containing an increasing silicon content.

* * * * *